United States Patent
Lee et al.

(10) Patent No.: US 7,459,364 B2
(45) Date of Patent: Dec. 2, 2008

(54) METHODS OF FORMING SELF-ALIGNED FLOATING GATES USING MULTI-ETCHING

(75) Inventors: Sang-Hoon Lee, Gyeonggi (KR); Hun-Hyeoung Leam, Gyeonggi-do (KR); Jai-Dong Lee, Gyeonggi-do (KR); Jung-Hwan Kim, Gyeonggi-do (KR); Young-Sub You, Gyeonggi-do (KR); Ki-Su Na, Gyeonggi-do (KR); Woong Lee, Seoul (KR); Yong-Sun Lee, Seoul (KR); Won-Jun Jang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 387 days.

(21) Appl. No.: 11/178,709

(22) Filed: Jul. 11, 2005

(65) Prior Publication Data
US 2006/0068547 A1 Mar. 30, 2006

(30) Foreign Application Priority Data
Jul. 12, 2004 (KR) ...................... 10-2004-0054060

(51) Int. Cl.
*H01L 21/336* (2006.01)
(52) U.S. Cl. .................. 438/257; 438/211; 438/424; 438/673; 438/713; 438/978
(58) Field of Classification Search ................. 438/257, 438/211, 424, 673, 713, 978, 458
See application file for complete search history.

(56) References Cited

U.S. PATENT DOCUMENTS

| | | | | |
|---|---|---|---|---|
| 6,093,606 A | * | 7/2000 | Lin et al. | 438/259 |
| 6,174,787 B1 | * | 1/2001 | Fuller et al. | 438/440 |
| 6,222,225 B1 | * | 4/2001 | Nakamura et al. | 257/315 |
| 6,465,293 B2 | | 10/2002 | Park et al. | 438/214 |
| 6,495,467 B2 | * | 12/2002 | Shin et al. | 438/706 |
| 6,541,351 B1 | * | 4/2003 | Bartlau et al. | 438/426 |
| 6,743,675 B2 | * | 6/2004 | Ding | 438/257 |
| 6,974,747 B2 | * | 12/2005 | Park | 438/257 |
| 2003/0119263 A1 | * | 6/2003 | Lee et al. | 438/259 |
| 2003/0199149 A1 | * | 10/2003 | Lee et al. | 438/424 |
| 2004/0106256 A1 | * | 6/2004 | Dong et al. | 438/257 |
| 2004/0178470 A1 | * | 9/2004 | Hieda | 257/510 |
| 2004/0266199 A1 | * | 12/2004 | Lee | 438/705 |
| 2007/0026651 A1 | * | 2/2007 | Leam et al. | 438/552 |
| 2007/0187748 A1 | * | 8/2007 | Hsiao et al. | 257/315 |

FOREIGN PATENT DOCUMENTS

| | | | |
|---|---|---|---|
| KR | 10-2003-0023488 | * | 4/2003 |
| KR | 1020030053312 A | | 6/2003 |

* cited by examiner

*Primary Examiner*—Matthew S. Smith
*Assistant Examiner*—Ankush K Singal
(74) *Attorney, Agent, or Firm*—Myers Bigel Sibley & Sajovec, P.A.

(57) ABSTRACT

A method of forming a floating gate of a non-volatile memory device can include etching a mask pattern formed between field isolation regions in a field isolation pattern on a substrate to recess a surface of the mask pattern below an upper surface of adjacent field isolation regions to form an opening having a width defined by a side wall of the adjacent field isolation regions above the surface. Then the adjacent field isolation regions is etched to increase the width of the opening.

14 Claims, 6 Drawing Sheets

METHODS OF FORMING SELF-ALIGNED FLOATING GATES USING MULTI-ETCHING

CROSS-REFERENCE TO RELATED APPLICATION

This application relies for priority upon Korean Patent Application No. 2004-54060 filed on Jul. 12, 2004, the content of which is herein incorporated by reference in its entirety.

FIELD OF THE INVENTION

The present invention relates to methods of forming semiconductor devices, and more particularly, to methods of forming a non-volatile devices.

BACKGROUND

Data stored in a volatile memory device, such as a dynamic RAM (DRAM) and a static RAM (SRAM), is lost when the power is turned off, and data stored in a non-volatile memory device is maintained even though the power is turned off. While the volatile memory device can have the advantage of a high speed, the non-volatile memory device may operate at a relatively low speed.

An example of a flash memory device is discussed in U.S. Pat. No. 6,465,293 ('293). According to the '293 patent, a semiconductor substrate on which an isolation layer is formed is provided and an oxide layer is formed on the substrate and the isolation layer, and the oxide layer is patterned to expose a portion of the substrate on which a floating gate is to be formed to thereby form an oxide pattern. A tunnel oxide layer and a first polysilicon layer are sequentially formed on the substrate including the oxide pattern, and then the first polysilicon layer is removed and planarized until the tunnel oxide layer is exposed to thereby form a floating gate self-aligned by the oxide pattern through which the substrate is partially exposed.

The exposed tunnel oxide layer and the oxide pattern are sequentially etched to a predetermined depth, and a dielectric layer is coated on the substrate including the etched tunnel oxide layer and the etched oxide pattern. A second polysilicon layer, a tungsten silicide layer and a hard mask layer are sequentially formed on the substrate and are patterned to thereby form a control gate. Impurities are implanted onto the substrate at both sides of the floating gate to thereby form a junction area.

As the level of integration in semiconductor device increases an aspect ratio of an opening defined by the above oxide pattern may be increases so that voids may be formed in the first polysilicon layer formed in the opening due to a shape of the oxide pattern.

The void in the first polysilicon layer may be exposed by the planarization process, which may produce a seam on a surface of the floating gate. The seam on the surface of the floating gate may deteriorate the breakdown voltage of the dielectric layer on the floating gate, and may reduces the coupling ratio of the flash memory device. In addition, the seam on the surface of the floating gate may increase the leakage current through the dielectric layer.

It has been suggested that an upper portion of the first polysilicon layer may be removed and an additional polysilicon layer may be formed in place of the removed first polysilicon layer to remove the void in the first polysilicon layer. However, the etchant used to remove the first polysilicon layer may cause damage to the tunnel oxide layer between the first polysilicon layer and the substrate, which may deteriorate the breakdown voltage of the tunnel oxide layer.

SUMMARY

Embodiments according to the invention can provide methods of forming self-aligned floating gates using multi-etching. Pursuant to these embodiments, a method of forming a floating gate of a non-volatile memory device can include etching a mask pattern formed between field isolation regions in a field isolation pattern on a substrate to recess a surface of the mask pattern below an upper surface of adjacent field isolation regions to form an opening having a width defined by a side wall of the adjacent field isolation regions above the surface. Then the adjacent field isolation regions is etched to increase the width of the opening.

In some embodiments according to the invention, the method further includes etching the surface of the of the mask pattern in the opening and an oxide layer thereunder to alter a side wall profile of the adjacent field isolation regions below the surface of the mask pattern. In some embodiments according to the invention, the surface of the mask pattern below the upper surface of adjacent field isolation regions defines a boundary above which a side wall profile is curved outward to the upper surface and below which a side wall profile is angled outward toward the substrate.

In some embodiments according to the invention, etching the surface of the of the mask pattern includes etching the surface of the of the mask pattern to alter the side wall profile at the boundary. In some embodiments according to the invention, etching the surface of the of the mask pattern to alter the side wall profile at the boundary further includes etching the side wall below the boundary to alter the side wall profile. In some embodiments according to the invention, etching the side wall below the boundary to alter the side wall profile further includes simultaneously further etching the upper surface of the adjacent field isolation regions.

In some embodiments according to the invention, the method further includes etching an oxide layer beneath the mask pattern while simultaneously further etching the upper surface of the adjacent field isolation regions. In some embodiments according to the invention, etching an oxide layer beneath the mask pattern exposes the substrate, the method further includes forming a tunnel oxide layer on the exposed substrate through the opening. A floating gate is formed on the tunnel oxide layer self-aligned to the adjacent field isolation regions.

In some embodiments according to the invention, etching a mask pattern is preceded by implanting impurities into the adjacent field isolation regions to increase an etch rate of the adjacent field isolation regions without the implanted impurities. In some embodiments according to the invention, the impurities can be Argon, Nitrogen, and/or helium.

In some embodiments according to the invention, implanting impurities into the adjacent field isolation regions includes implanting the impurities at an angle of about 45 degrees to about 90 degrees measured relative to the a surface of the substrate. In some embodiments according to the invention, etching a mask pattern includes etching the mask pattern to recess the surface about 500 Angstrom to about 600 Angstroms below the upper surface of the adjacent field isolation regions.

In some embodiments according to the invention, etching the adjacent field isolation regions to increase the width of the opening includes etching the adjacent field isolation regions to reduce a height thereof and to increase the width of the opening by wet etching and/or chemical dry etching.

In some embodiments according to the invention, an etchant for use in the wet etching is hydrogen fluoride (HF), a mixed solution comprising ammonium hydroxide (NH4OH), hydrogen peroxide (H2O2) and de-ionized water (H2O), and/or a Limulus Amebocyte Lysate (LAL) solution comprising ammonium fluoride, hydrogen fluoride and distilled water. In some embodiments according to the invention, the etching gas is a mixture of hydrogen fluoride gas and water vapor and/or a mixture gas of carbon fluoride and oxygen.

In some embodiments according to the invention, a method of forming a floating gate of a non-volatile memory device includes implanting impurities into adjacent field isolation regions on a substrate to increase an etch rate of the adjacent field isolation regions without the implanted impurities. A mask pattern is etched between field isolation regions in a field isolation pattern on a substrate to recess a surface of the mask pattern below an upper surface of adjacent field isolation regions to form an opening having a width defined by a side wall of the adjacent field isolation regions above the surface. Then the side wall of the adjacent field isolation regions is etched to increase the width of the opening.

In some embodiments according to the invention, a method of manufacturing a semiconductor device includes forming a mask pattern on a substrate, the mask pattern including a first opening through which a first portion of the substrate is exposed. A trench is formed by etching the first portion of the substrate. An isolation pattern is formed filling up the first opening and the trench. A second opening is formed by etching an upper portion of the mask pattern, so that the second opening is defined by the upper portion of the isolation pattern and a recessed mask pattern. The upper portion of the isolation pattern is partially removed defining the second opening to thereby increase a size of the second opening. A third opening is formed by etching the recessed mask pattern, a second portion of the substrate being exposed through the third opening. A conductive layer is formed on the second portion of the substrate and the isolation pattern to a thickness to fill up the second and the third openings.

DESCRIPTION OF EMBODIMENTS ACCORDING TO THE INVENTION

The invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section (and/or plan view) illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

Figure 1:
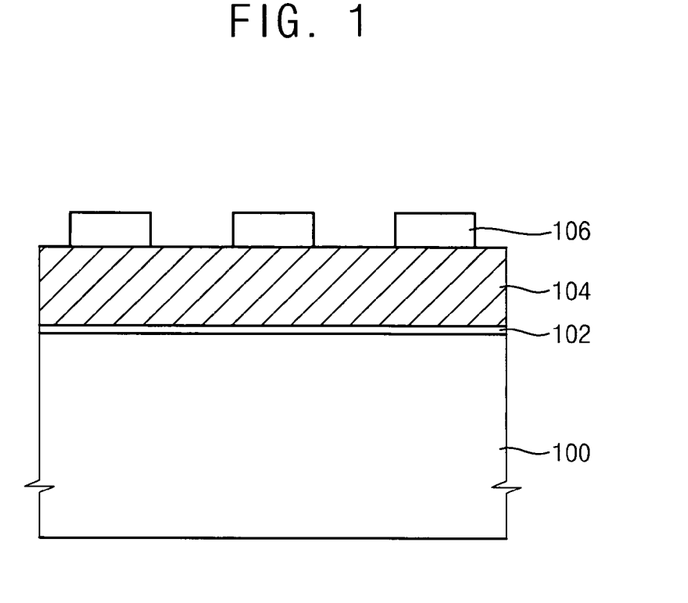
FIG. 1 is a cross sectional view illustrating a pad oxide layer and a mask layer on a semiconductor substrate in some embodiments according to the invention.
Figure 2:
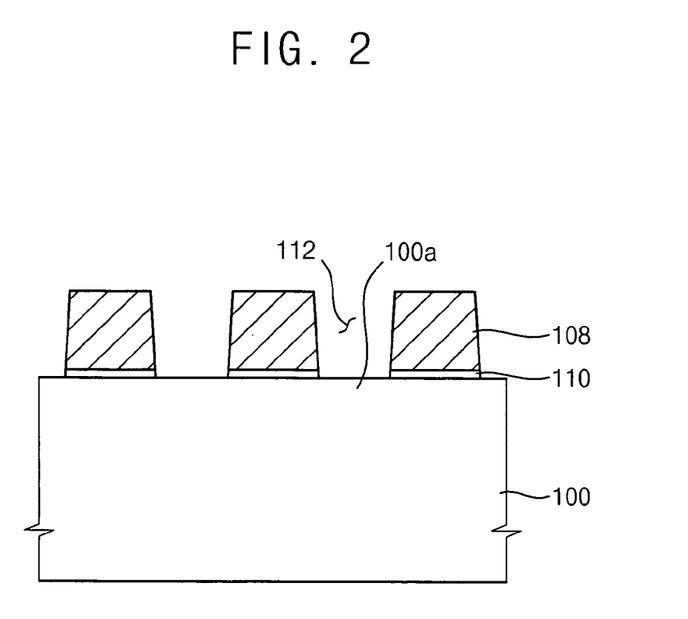
FIG. 2 is a cross sectional view illustrating a mask pattern on the substrate in some embodiments according to the invention.

FIGS. 1 to 10 are cross sectional views illustrating processing steps for a method of manufacturing a semiconductor device in some embodiments according to the invention. FIG. 1 is a cross sectional view illustrating a pad oxide layer and a mask layer on a semiconductor substrate, and FIG. 2 is a cross sectional view illustrating a mask pattern on the substrate.

Referring to FIGS. 1 and 2, a pad oxide layer 102 is formed on a semiconductor substrate such as a silicon wafer, and a mask layer 104 is formed on the pad oxide layer 102. In some embodiments according to the invention. The pad oxide layer is formed to a thickness of about 70 Å to about 100 Å through a thermal oxidation process or a chemical vapor deposition (CVD) process. In some embodiments according to the invention, the pad oxide layer 102 is formed at a temperature of about 750° C. to about 900° C. for a surface treatment of the substrate 100.

The mask layer 104 can be silicon nitride formed to a thickness of about 1500 Å through a low pressure CVD (LPCVD) process or a plasma enhanced CVD (PECVD) process. A dichlorosilane (SiH2Cl2) gas, a silane (SiH4) gas and an ammonia (NH3) gas can be used in the LPCVD process.

A photoresist pattern 106 through which a surface of the mask layer 104 is partially exposed is formed on the mask layer 104 through a photolithography process, and then the mask layer 104 and the pad oxide layer 102 are sequentially etched using the photoresist pattern 106 as an etching mask to thereby form a mask pattern 108 and a pad oxide pattern 110 through which a first portion 100a of the substrate is exposed. The mask pattern 108 defines a first opening 112 on the substrate 100 and the first portion 100a of the substrate 100 is exposed through the first opening 112. In some embodiments according to the invention, the first portion 100a of the substrate 100 is allocated to a device isolation region of the substrate 100. In some embodiments according to the invention, the mask layer 104 and the pad oxide layer 102 are etched using a plasma dry etching process or a reactive ion etching process. The photoresist pattern 106 is removed via an ashing process and a strip process after the mask pattern 108 is formed on the substrate 100.

Figure 3:
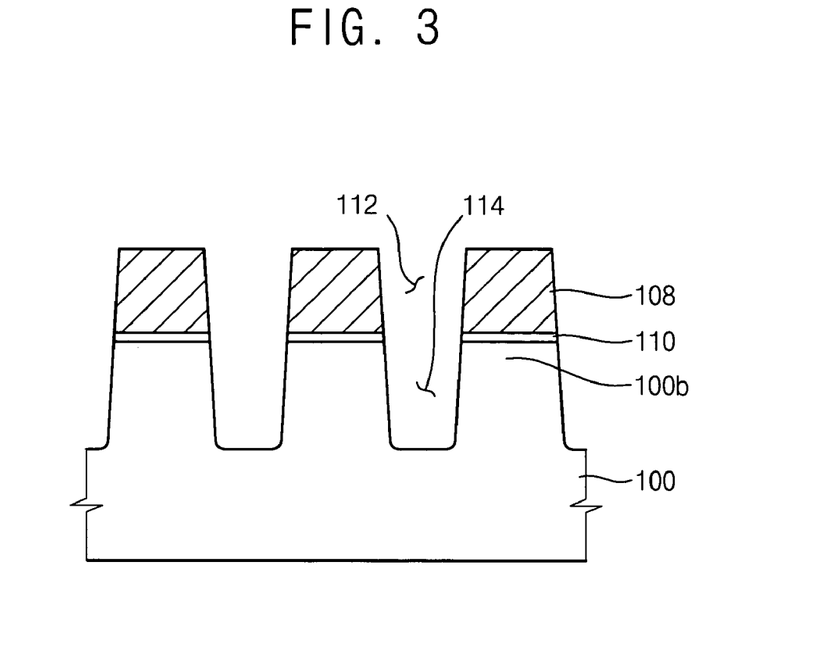
FIG. 3 is a cross sectional view illustrating a trench on the substrate in some embodiments according to the invention.
Figure 4:
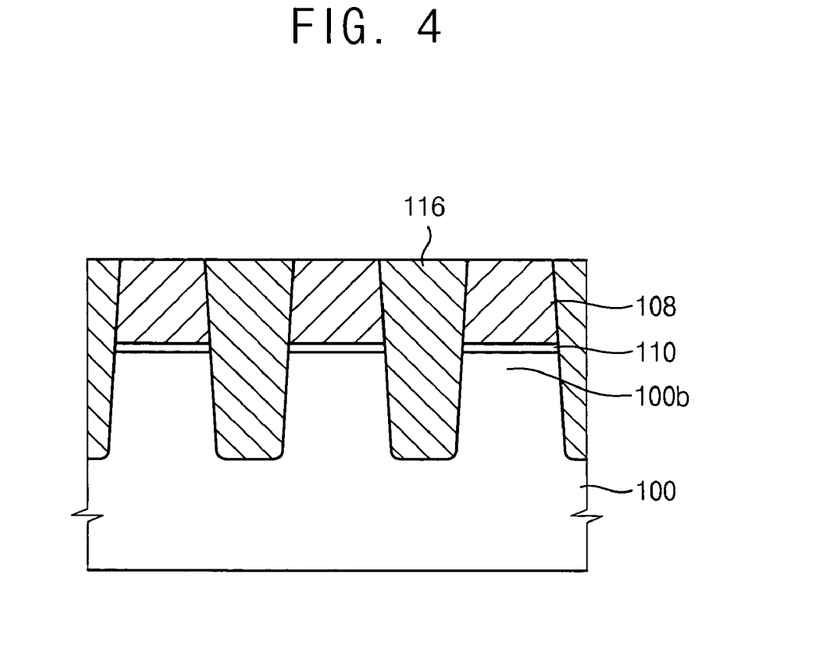
FIG. 4 is a cross sectional view illustrating a field isolation layer filling the trench in some embodiments according to the invention.

FIG. 3 is a cross sectional view illustrating a trench on the substrate, and FIG. 4 is a cross sectional view illustrating a field isolation layer filling the trench. Referring to FIGS. 3 and 4, the first portion 100a of the substrate 100 is etched using the mask pattern as an etching mask to thereby form a trench 114 on the substrate 100 in the first direction. In some embodiments according to the invention, the trench 114 has a depth of about 1000 Å to 5000 Å. In some embodiments according to the invention, the trench 114 has a depth of about 2300 Å.

In some embodiments according to the invention, sidewalls of the trench 114 and the first opening 112 are angled with respect to the substrate 100, so that an upper portion of the first opening 112 is larger (i.e., wider) than a lower portion thereof, and an upper portion of the trench 114 is also larger than a lower portion thereof.

Although the first opening and the trench are described above as being individually formed using the photoresist pattern 106 and the mask pattern 108, respectively, the first opening 112 and the trench 114 could also be formed through an in-situ process in the same chamber.

A heat oxidation treatment may be conducted on the sidewall of the trench 114 for curing damage caused by a high-energy ion impact to the sidewall of the trench in an etching process for forming the trench and for preventing a leakage current from the sidewall of the trench 114. A trench oxide layer (not shown) is formed on the sidewall of the trench 114 to a thickness of about 50 Å to about 250 Å due to the heat oxidation treatment. In some embodiments according to the invention, a nitride layer is formed on the trench oxide layer to a thickness of about 50 Å to about 100 Å in order that diffusion of impurities such as carbon (C) and hydrogen (H) into a second portion 100b of the substrate 100 from a field isolation layer (not shown) that is to be formed in a subsequent process can be reduced. The second portion 100b of the substrate 100 is surrounded by the trench 114 and is referred to as an active region of the substrate 100.

A field isolation layer is formed on the substrate 100 including the trench 114 to a sufficient thickness to fill up the trench 114. The field isolation layer includes a silicon oxide layer such as an undoped silicate glass (USG) layer, a tetraethylorthosilicate (TEOS) layer and a high-density plasma (HDP) oxide layer. In some embodiments according to the invention, the oxide layer formed through an HDP-CVD process using silane (SiH4) gas, oxygen (O2) gas and argon (Ar) gas as a plasma source gas.

The field isolation layer is removed and planarized by a planarization process such as a chemical mechanical polishing (CMP) process until an upper surface of the mask pattern 108 is exposed, so that the field isolation layer only remains in the trench 114 to thereby form a field isolation pattern 116. The field isolation pattern 116 functions as field oxide layer for defining an active region, and the second portion 100b of the substrate 100 is separated and isolated from the first portion 100a of the substrate 100 and functions as an active region of the substrate 100.

Figure 5:
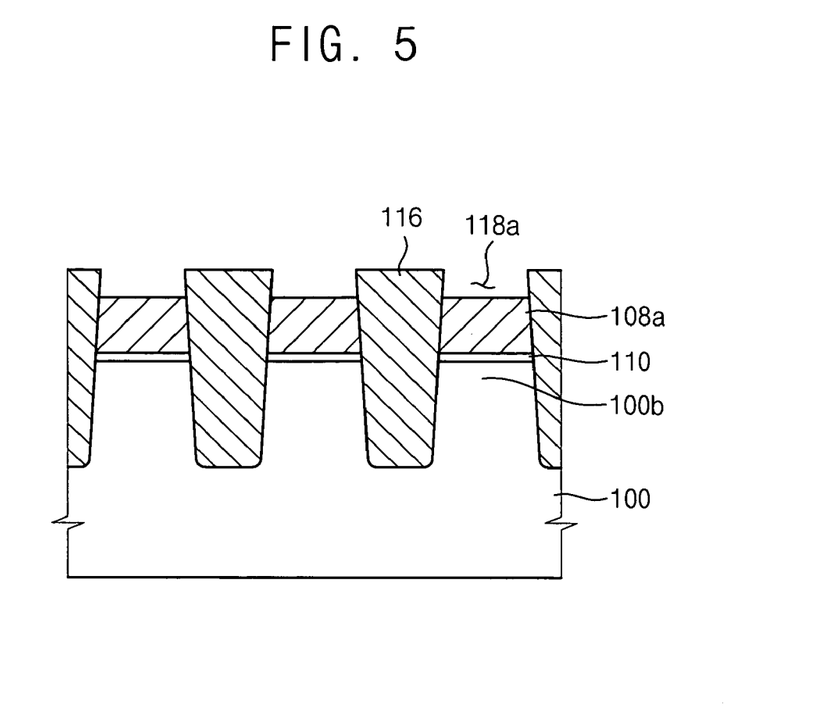
FIG. 5 is a cross sectional view illustrating the second opening through which an upper portion of the field isolation pattern shown in FIG. 4 is exposed, in some embodiments according to the invention.
Figure 6:
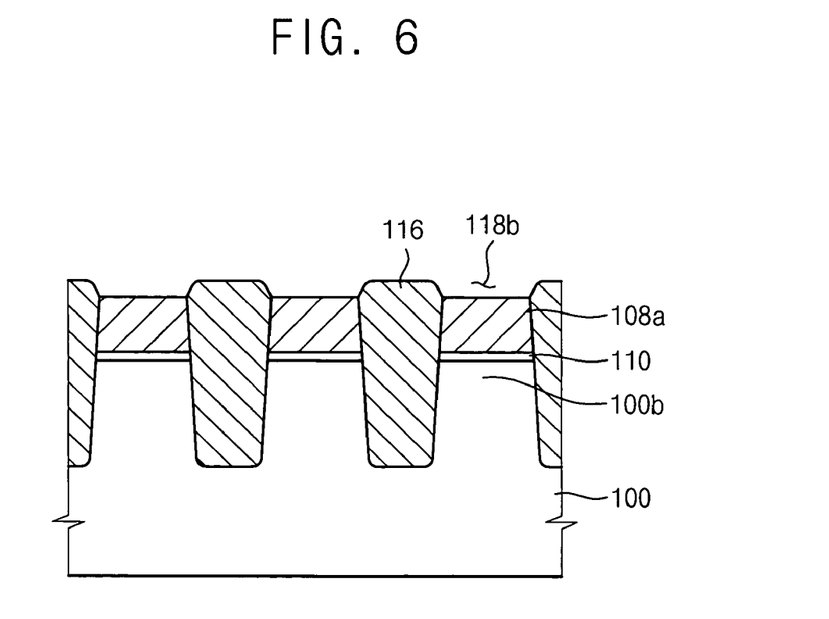
FIG. 6 is a cross sectional view illustrating the second opening of which a width is increased in some embodiments according to the invention.
Figure 7:
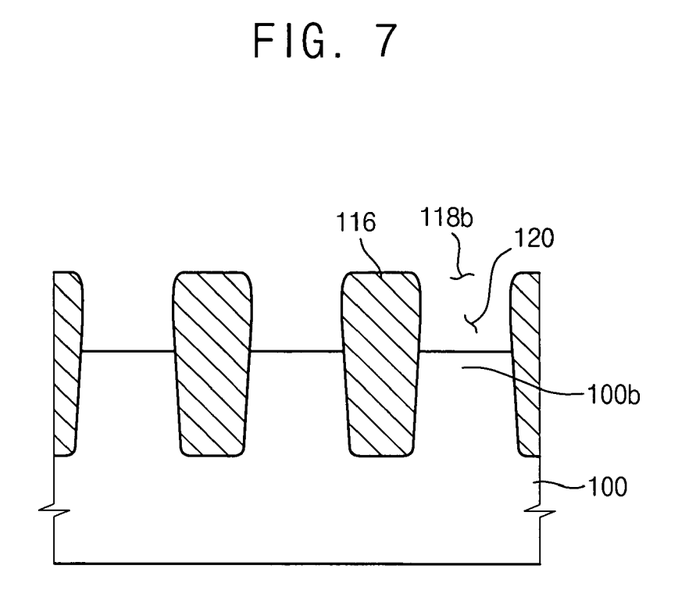
FIG. 7 is a cross sectional view illustrating a third opening through which an active region of the substrate is exposed in some embodiments according to the invention.

FIG. 5 is a cross sectional view illustrating the second opening through which an upper portion of the field isolation pattern shown in FIG. 4 is exposed, and FIG. 6 is a cross sectional view illustrating the second opening of which a width is increased. FIG. 7 is a cross sectional view illustrating a third opening through which an active region of the substrate is exposed.

Referring to FIGS. 5 to 7, an upper portion of the mask pattern 108 is removed to thereby form a second opening 118a defined by an upper portion of the field isolation pattern 116 and a recessed mask pattern 108a. Accordingly, an upper portion of the field isolation pattern 116 functions as a sidewall of the second opening 118a. In some embodiments according to the invention, the upper portion of the mask pattern 108 is etched to a depth of about 500 Å to about 600 Å using an etchant including a phosphoric acid, so that the second opening has a height of about 500 Å to about 600 Å.

A cleaning process may be further performed prior to the etching process for removing the upper portion of the mask pattern 108, so that a native oxide layer and contaminants on the field isolation pattern 116 and the mask pattern 108 may be removed. The cleaning process may utilize a cleaning solution comprising hydrogen fluoride (HF) or a standard cleaning solution (SC-1) comprising ammonium hydroxide (NH4OH), hydrogen peroxide (H2O2) and water (H2O).

According to FIG. 6, the upper portion of the field isolation pattern 116 is partially etched to thereby increase a size (i.e., width) of the second opening 118a. In particular, the side wall of the adjacent field isolation patterns 116 are etched so that the side wall has a curved profile that extends outward to define the second opening having the increased width. Hereinafter, the second opening having an increased size is referred to as an enlarged second opening 118b.

It will be understood that the recessed mask pattern 108a defines a boundary between the side wall above having the curved profile and the side wall portion below having a profile that is angled outward toward a bottom adjacent to the oxide pattern 110.

In some embodiments according to the invention, the upper portion of the field isolation pattern 116 is etched by an isotropic etching process such as a wet etching process using an etchant and a chemical dry etching process using an etching gas. Examples of the etchant include a solution comprising hydrogen fluoride (HF), a mixed solution comprising ammonium hydroxide (NH4OH), hydrogen peroxide (H2O2) and de-ionized water (H2O), or a Limulus Amebocyte Lysate (LAL) solution comprising ammonium fluoride, hydrogen fluoride and distilled water. These can be used alone or in combinations thereof. Examples of the etching gas include a mixture gas of hydrogen fluoride gas and water vapor, a mixture gas of carbon fluoride and oxygen, etc. These can also be used alone or in a combination thereof.

According to FIG. 7, the recessed mask pattern 108a and the oxide pattern 110 are removed from the substrate 100 between the adjacent field isolation patterns 116 to thereby form a third opening through which the active region (the second portion 100b of the substrate) is exposed. In some embodiments according to the invention, the recessed mask pattern 108a is etched using an etchant, such as, a phosphoric acid, and the pad oxide pattern 110 is etched using an etchant of hydrogen fluoride.

A corner portion of the field isolation pattern 116 may be rounded while the oxide pattern 110 is removed. In the present embodiment, a horn portion of the field isolation pattern 116 at the boundary is etched and rounded while etching the oxide pattern 110, which may improve a side wall profile of the field isolation pattern 116.

Figure 8:
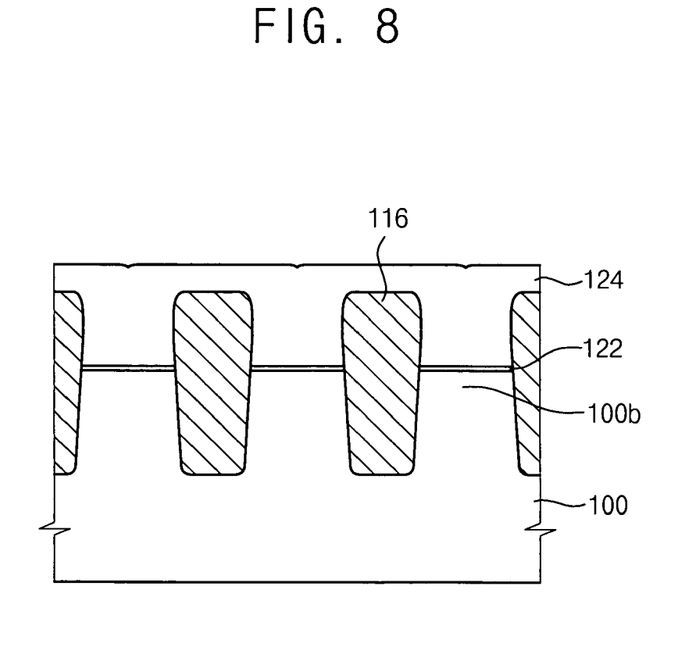
FIG. 8 is a cross sectional view illustrating a tunnel oxide pattern and a first conductive layer formed on the active region and field isolation pattern in some embodiments according to the invention.
Figure 9:
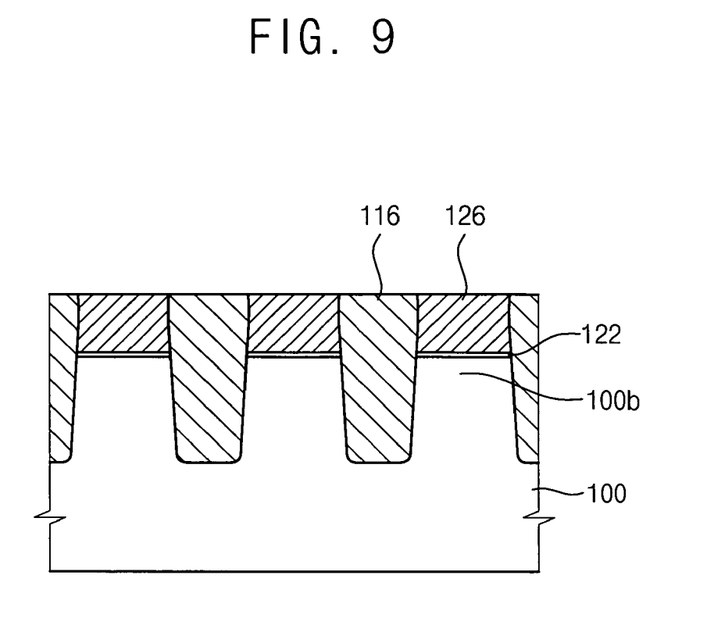
FIG. 9 is a cross sectional view illustrating a floating gate electrode in some embodiments according to the invention.

FIG. 8 is a cross sectional view illustrating a tunnel oxide pattern and a first conductive layer formed on the active region and field isolation pattern, and FIG. 9 is a cross sectional view illustrating a floating gate electrode. Referring to FIGS. 8 and 9, a tunnel oxide layer 122 is formed on the active region 100b exposed through the enlarged second opening 118b and the third opening 120. In some embodiments according to the invention, the tunnel oxide layer 122 is a silicon oxide layer formed by a thermal oxidation process, a silicon oxide layer doped with fluorine or carbon, or a low-k material layer having an extremely low dielectric constant. In some embodiments according to the invention, the low-k material layer is an organic polymer. In some embodiments according to the invention, the organic polymer includes a poly allyl ether resin, a ring-type fluorine resin, a siloxane copolymer, a fluorinated poly allyl ether resin, a polypentafluorostyrene resin, a polytetrafluorostyrene resin, a fluorinated polyimide resin, a fluorinated polynaphthalene resin, a polycide resin, etc. These can be used alone or in a combination thereof. The organic polymer can be formed through a PECVD, an HDP-CVD, an APCVD or a spin coating process.

A first conductive layer 124 is formed on the substrate 100 including the tunnel oxide layer 122 and the field isolation pattern 116 to a sufficient thickness to fill the enlarged second opening 118b and the third opening 120. In some embodiments according to the invention, the first conductive layer 124 is polysilicon doped with impurities, and is formed by an LPCVD process. The impurities are doped into the polysilicon by a doping process such as a diffusion process, an ion implantation process or an in-situ doping process.

As described above, the enlarged second opening 118b is larger (i.e., wider) than the third opening 120, and the field isolation layer 116 may have an improved sidewall profile, which may reduce the likelihood of the formation of voids in the first conductive layer 124.

The first conductive layer 124 is removed and planarized by a planarization process such as a CMP process until a top surface of the field isolation layer 116 is exposed, so that a floating gate electrode 126 is formed on the active region 100b of the substrate 100. In some embodiments according to the invention, the top portion of the field isolation layer 116, which defines the enlarged second opening 118b, is somewhat removed; thus, an upper portion of the floating gate electrode 126 becomes equal to a lower portion of the floating gate electrode 126 in size. As described above, reducing the likelihood of a void may reduce the formation of voids in the first conductive layer 124, which may help reduce seams on the surface of the floating gate electrode 126.

Figure 10:
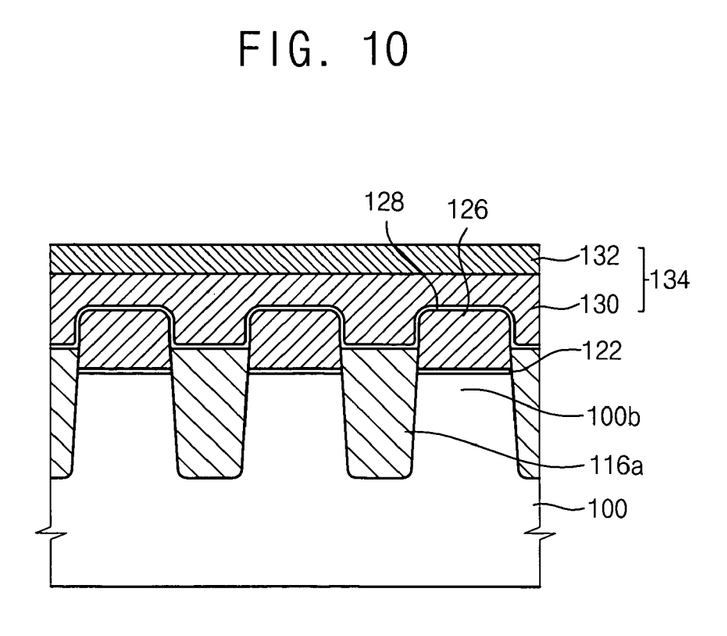
FIG. 10 is a cross sectional view illustrating a dielectric layer formed on the floating gate electrode in some embodiments according to the invention.

FIG. 10 is a cross sectional view illustrating a dielectric layer formed on the floating gate electrode. Referring to FIG. 10, the field isolation pattern 116 is partially removed to a predetermined depth from the top surface thereof, so that an upper sidewall of the floating gate electrode 126 is exposed to surroundings. Hereinafter, the field isolation pattern 116 that is removed and recessed from a top surface of the floating gate electrode 126 is referred to as a recessed field isolation pattern 116a. In some embodiments according to the invention, the field isolation pattern 116 is partially etched by an isotropic or an anisotropic etching process under the condition that the tunnel oxide pattern 122 in the active region 100b is not exposed. Accordingly, an etchant or an etching gas in the etching process for partially removing the field isolation pattern 116 may not significantly damage the tunnel oxide pattern 122 in the active region 100b. A corner portion of the floating gate electrode 126 may be rounded in the etching process for removing the field isolation pattern 116.

A dielectric layer 128 is formed on the floating gate electrode 126 and the recessed field isolation pattern 116a. In some embodiments according to the invention, the dielectric layer 128 is a composite dielectric layer having an oxide/nitride/oxide (ONO) structure or a low-k material layer having an extremely low dielectric constant. In some embodiments according to the invention, the composite dielectric layer is formed by an LPCVD process, and the low-k material layer is formed by atomic layer deposition (ALD) or a CVD process. In some embodiments according to the invention, the low-k material layer is Y2O3, HfO2, ZrO2, Nb2O5, BaTiO3, and/or SrTiO3.

As shown in FIG. 10, the profile of the floating gate electrode 126 can have rounded edges, which may improve leakage current from the dielectric layer 128 and the improve the breakdown voltage of the dielectric layer 128.

A second conductive layer 130 and a control gate layer 134 are sequentially formed on the dielectric layer 128. In the present embodiment, the second conductive layer 130 exemplarily comprises polysilicon doped with impurities, and the control gate layer 134 includes a third conductive layer 132 comprising a metal silicide. Examples of the metal silicide include a tungsten silicide (WSix), a titanium silicide (TiSix), a cobalt silicide (CoSix), a tantalum silicide (TaSix), etc. These can be used alone or in a combination thereof.

Impurities are implanted onto a surface of the active region 100b at both side portions of the gate structure, which are symmetrical to the gate structure in the first direction, so that a source/drain region is formed on the substrate 100 to thereby complete the semiconductor device of the present invention such as a flash memory device.

Figure 11:
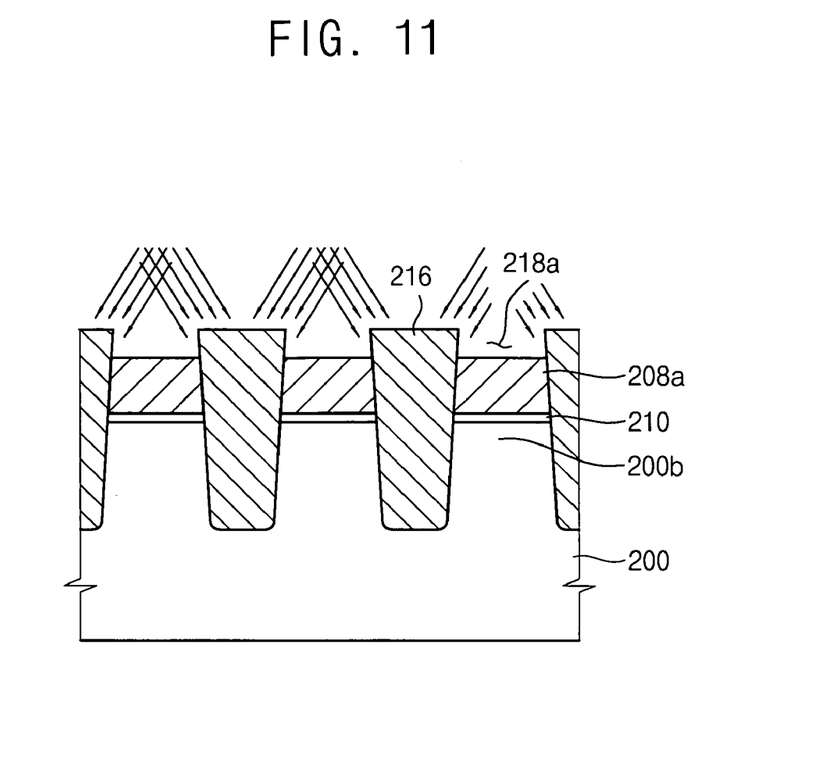
FIGS. 11 and 12 are cross sectional views illustrating forming a semiconductor device in some embodiments according to the invention.
Figure 12:
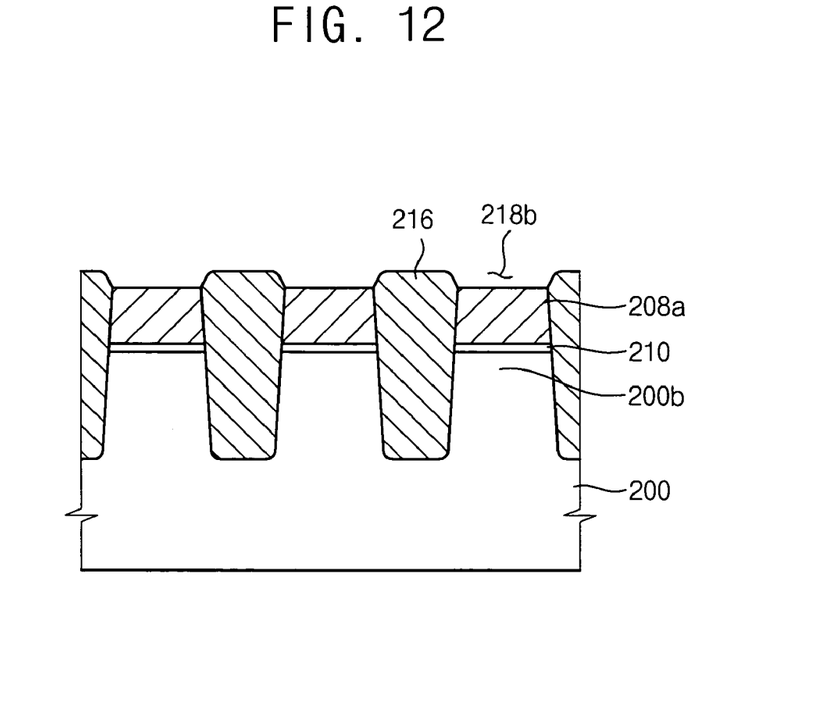

FIGS. 11 and 12 are cross sectional views illustrating methods of forming devices in some embodiments according to the present invention. Referring to FIGS. 11 and 12, a pad oxide pattern 210 and a mask pattern (not shown) are formed on a substrate 200, and a first opening (not shown) and a trench (not shown) are formed on the substrate 200 using the mask pattern as an etching mask. A field isolation pattern 216 is formed on the substrate 200 to fill up the first opening and the trench, so that an active region 200b of the substrate 200 is defined by the field isolation pattern 216.

An upper portion of the mask pattern is removed to thereby form a second opening 218a in which an upper sidewall of the field isolation pattern 216 is exposed. As described above in reference to FIGS. 13-10, the mask pattern is removed and recessed from a top surface the field isolation layer 216, which is referred to as a recessed mask pattern. Accordingly, the second opening 218a is defined by the upper sidewall of the field isolation pattern 216 and the recessed mask pattern. Since the above elements may be formed as described above with reference to FIGS. 1 to 5, further detailed description is omitted.

Impurities are implanted onto the upper portion of the field isolation pattern 216, so that an etching rate of the upper portion of the field isolation pattern 216 is increased. Accordingly, the upper portion of the field isolation pattern 216 can be more readily etched and rounded to thereby enlarge a size (i.e., width) of the second opening 218a. The second opening 218a of which the size is increased is referred to as an enlarged second opening 218b. In some embodiments according to the invention, impurities are argon (Ar), nitrogen (N), helium (He), etc, which can be used alone or in combinations thereof. In some embodiments according to the invention, the impurities are implanted onto the substrate 200 at an injection angle of about 45° to about 90° with relative to the substrate 200. The upper portion of the field isolation pattern 216 can be etched away using an isotropic etching process.

The recessed mask pattern 208a and the pad oxide pattern are removed from the substrate 200 to thereby form a third opening, and a tunnel oxide pattern is formed on the active region 200b of the substrate 200. A conductive layer is formed on the substrate 200 including the tunnel oxide pattern and the field isolation pattern 216 to a sufficient thickness to fill the enlarged second opening 218b and the third opening.

A floating gate electrode is formed from the conductive layer, and a dielectric layer and a control gate electrode are sequentially formed on the floating gate electrode in the same manner as described in Embodiment 1 with reference to FIGS. 7 and 10.

In some embodiments according to the invention, a first conductive layer from which a floating gate electrode is formed is formed on a tunnel oxide layer and a field isolation pattern to a sufficient thickness to fill up an enlarged second opening and a third opening; thus, void may be reduced in the first conductive layer. Accordingly, a seam may not be formed on a surface of the floating gate electrode formed by planarizing the conductive layer. In addition, a leakage current may be reduced and a breakdown voltage of the dielectric layer, which is formed on the floating gate electrode, may be sufficiently improved, and a coupling ratio of the flash memory cell may also be improved. Furthermore, an additional etching process to reduce the generation of voids in the conductive layer may be eliminated, so that damage to the tunnel oxide layer may be reduced.

Although the exemplary embodiments of the present invention have been described, it is understood that the present invention should not be limited to these exemplary embodiments but various changes and modifications can be made by one skilled in the art within the spirit and scope of the present invention as hereinafter claimed.

What is claimed is:

1. A method of manufacturing a semiconductor device, comprising:
    forming a mask pattern on a substrate, the mask pattern including a first opening through which a first portion of the substrate is exposed;
    forming a trench by etching the first portion of the substrate;
    forming an isolation pattern filling up the first opening and the trench;
    forming a second opening by etching an upper portion of the mask pattern, so that the second opening is defined by the upper portion of the isolation pattern and a recessed mask pattern;
    partially removing the upper portion of the isolation pattern defining the second opening to thereby increase a size of the second opening;
    forming a third opening by etching the recessed mask pattern, a second portion of the substrate being exposed through the third opening; and
    forming a conductive layer on the second portion of the substrate and the isolation pattern to a thickness to fill up the second and the third openings.

2. The method of claim 1, wherein the upper portion of the isolation pattern defining the second opening is removed by an isotropic etching process.

3. The method of claim 1, wherein the upper portion of the isolation pattern defining the second opening is removed by a wet etching process or a chemical dry etching process.

4. The method of claim 1, further comprising implanting impurities onto the exposed upper portion of the isolation pattern.

5. The method of claim 4, wherein the impurities include argon (Ar), nitrogen (N) or helium (He).

6. The method of claim 4, wherein the impurities are implanted through an ion implantation process.

7. The method of claim 6, wherein the impurities are implanted at an injection angle of about 45° to about 90° with respect to the substrate.

8. The method of claim 1, wherein forming the mask pattern includes:

forming a mask layer on the substrate; and patterning the mask layer to thereby form the mask pattern.

9. The method of claim 1, further comprising cleaning the mask pattern and the isolation pattern prior to forming the second opening.

10. The method of claim 1, wherein the conductive layer comprises polysilicon doped with impurities.

11. The method of claim 1, further comprising forming a tunnel oxide layer on the second portion of the substrate.

12. The method of claim 11, further comprising forming a floating gate electrode from the conductive layer by performing a planarization process until the isolation pattern is exposed.

13. The method of claim 12, wherein an upper portion of the isolation pattern defining the second opening is removed while the floating gate electrode is formed.

14. The method of claim 12, further comprising forming a dielectric layer on the floating gate electrode, and forming a control gate electrode on the dielectric layer.

* * * * *